United States Patent
Baxter et al.

(10) Patent No.: US 6,914,422 B2
(45) Date of Patent: Jul. 5, 2005

(54) CURRENT MONITORING/CONTROL CIRCUIT

(75) Inventors: Donald L. Baxter, Redondo Beach, CA (US); Kenneth B. Wheeler, Torrance, CA (US); David C. Nguyen, Irvine, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 90 days.

(21) Appl. No.: 10/680,707

(22) Filed: Oct. 7, 2003

(65) Prior Publication Data

US 2005/0073294 A1 Apr. 7, 2005

(51) Int. Cl.[7] .............................................. G01R 21/08
(52) U.S. Cl. ................................. 324/117 R; 324/126
(58) Field of Search ............................ 324/117 R, 126, 324/127, 158.1; 363/74–80; 336/214

(56) References Cited

U.S. PATENT DOCUMENTS

| | | | |
|---|---|---|---|
| 3,651,393 A | * | 3/1972 | Pohm ........................... 363/67 |
| 3,801,907 A | | 4/1974 | Lilienstein |
| 4,005,352 A | * | 1/1977 | Kugler et al. .................. 363/26 |
| 4,286,211 A | | 8/1981 | Nakamura et al. |
| 4,298,838 A | | 11/1981 | Akamatsu et al. |
| 4,823,074 A | | 4/1989 | McLyman |
| 4,914,381 A | | 4/1990 | Narod |
| 5,508,606 A | | 4/1996 | Ryczek |

FOREIGN PATENT DOCUMENTS

CA                763576            7/1967

* cited by examiner

*Primary Examiner*—Vinh Nguyen
*Assistant Examiner*—Russell M. Kobert
(74) *Attorney, Agent, or Firm*—John A. Miller; Warn, Hoffmann, Miller & LaLone, P.C.

(57) ABSTRACT

A current control that employs a magnetic amplifier and an active feedback circuit. The feedback circuit establishes the effective operating current of the amplifier at a fixed point. The magnetic amplifier includes a pair of oppositely wound gate windings, a bias winding and a control winding. The gate windings are driven by an oscillator driver that generates a gate winding current and a gate winding voltage. A reference voltage and the gate winding voltage are applied to a feedback amplifier and the feedback circuit. When the gate winding voltage becomes equal to the reference voltage, the feedback circuit is stable and the gate winding current is set to a desired zero current operating point.

19 Claims, 3 Drawing Sheets

US 6,914,422 B2

CURRENT MONITORING/CONTROL CIRCUIT

BACKGROUND OF THE INVENTION

1. Field of the Invention

This invention relates generally to a current monitoring and control circuit and, more particularly, to a current monitoring and control circuit that employs a magnetic amplifier and a feedback circuit, where the amplifier circuit provides a bias current that causes the feedback circuit to operate the amplifier at a predetermined point to improve output linearity.

2. Discussion of the Related Art

Saturable core reactors have been employed in the art as variable impedance devices to detect direct current flowing in an operating circuit, while maintaining isolation between the operating circuit and an output circuit. A saturable reactor is a magnetic circuit element including a coil of wire wound around a magnetic core. The magnetic core significantly alters the behavior of the coil by increasing its magnetic flux and by confining most of the flux to the core. Magnetic flux density (B) is a function of applied magnet motive force (MMF), which is proportional to the ampere turns in the coil. The core includes a plurality of tiny magnetic domains made up of magnetic dipoles. These domains define the magnetic flux that adds to or subtracts from the flux provided by the magnetizing current. After overcoming initial friction, the magnetic domains rotate like small DC motors to become aligned with the applied field. As the MMF is increased, the domains rotate one by one until they all are in alignment and the core is saturated. Eddy currents are induced as the flux changes, causing added loss.

Magnetic amplifiers that employ saturable absorbers are known in the art, and are used for various applications, including current monitors for monitoring battery drain in spacecraft telemetry systems. Further, magnetic amplifiers are employed for current control in various systems, such as battery charging circuits and motor control circuits.

A conventional magnetic amplifier typically includes two saturable reactors having matched magnetic (permalloy) cores, each being wound with several turns of wires, such as 1500 turns of 38 awg wire. In a magnetic amplifier, each reactor winding is an amplifier gate winding. The two reactor gate windings are coupled in series and have opposing phase, i.e., are wound in opposite directions. The two reactors are positioned side by side and a bias winding, typically about 1000 turns (36 awg or larger), is wound around the reactors. A single control winding extends through the center of the cores, although, multiple turns may be used to increase amplifier sensitivity. The gate windings are coupled in series in opposing phase so that one reactor is reset as the other reactor drives towards saturation. A control current running through the control winding is measured by the magnetic amplifier by magnetic coupling.

An alternating current (AC) is applied to the gate windings and the output of the gate windings is full-wave rectified, filtered and resistively loaded to give a DC output voltage proportional to the control current. If the magnetic amplifier operated perfectly, and no current flowed through the control winding, then the current in the gate windings would oppose each other and the DC output voltage would be zero. The control current in the control winding moves the zero axis of the MMF produced by the gate current in the gate windings, and thereby reduces the inductance of the gate windings creating an imbalance between them. The greater the control current in the control winding, the smaller the inductance within a given range of current values. Thus, the greater the control current, the greater the imbalance between the gate windings, and the larger the output voltage.

In some applications, the bias winding is shorted or left open, and thus does not affect the magnetic coupling between the control windings and the gate windings. Sometimes it is desirable to shift the zero point of the output voltage when no control current is flowing through the control winding. By applying a bias voltage to the bias winding, the zero point of the output voltage is moved. This has application for determining the direction of the current through the control winding, as will be discussed in more detail below.

A magnetic amplifier operates similarly in principle to a current transformer. The ideal current transfer in the amplifier is expressed by:

$$N_c I_c = N_g I_g + N_b I_b$$

$N_c$ is the number of turns of the control winding, $I_c$ is the control winding current, $N_g$ is the number of turns of the gate windings, $I_g$ is the gate winding current, $N_b$ is the number of turns of the bias winding, and $I_b$ is the bias winding current. The output voltage is $V_o = I_o R_o$ when it is applied across a fixed load resistor, where:

$$I_o = (N_c I_c - N_b I_b)/N_g, \text{ and}$$

$$I_c = (N_g I_o + N_b I_b)/N_c$$

FIG. 1 is a schematic diagram of a conventional magnetic amplifier 10 of the type discussed above. The amplifier 10 includes a control winding 12, a bias winding 14, a first gate winding 16 and a second gate winding 18 coupled in series and opposing phase with the gate winding 16. In this design, the bias winding 14 is shorted and is not used. The amplifier 10 further includes an oscillator driver 24 that drives a transformer 26 with a suitable AC signal. The transformer 26 increases the voltage of the AC signal from the oscillator driver 24. The secondary winding of the transformer 26 is electrically coupled to the gate windings 16 and 18 and a rectifier 28 including a diode bridge. The AC signal applied to the gate windings 16 and 18 generates the gate winding current $I_g$. The gate winding current $I_g$ is filtered and averaged by a filter 30 including a resistor 32 and a capacitor 34. Thus, the gate current $I_g$ is rectified, filtered and resistively loaded to provide a DC output voltage $V_o$ representative of the gate winding current $I_c$ that is proportional to the control current $I_c$.

When there is no control current $I_c$ in the control winding 12, the gate winding current $I_g$ is nearly zero because of the equal and opposite windings of the gate windings 16 and 18 are equal and opposite. The control current $I_c$ to be measured is applied to the control winding 12 and alters the gate winding current $I_g$ in the gate windings 16 and 18 by magnetic coupling, as discussed above. Therefore, as the control current $I_c$ increases either in the positive or negative direction, the output voltage $V_0$ across the resistor 32 increases.

Because the gate windings 16 and 18 are driven by a square wave AC signal from the driver 24 and the output voltage $V_o$ is full-wave rectified, the amplifier 10 cannot determine the direction of flow of the control current $I_c$. In other words, a positive or negative control current $I_c$ in the control winding 12 generates the same positive DC output voltage $V_0$. FIG. 2 shows a typical (ideal) control current $I_c$ to output voltage transfer function for a current transducer or magnetic amplifier having an 80 amp operating range. The graph shows the output voltage $V_O$ in relation to the control current $I_c$ on the control winding 12, where the control current $I_c$ changes linearly between −80 amps and +80 amps. However, the output voltage $V_O$ goes from +5 volts to 0 volts, and then back to +5 volts, thus showing that the output voltage $V_O$ does not identify the polarity of the control current $I_c$.

Further, the output voltage $V_O$ of the amplifier 10 is not linear with respect to the control current $I_c$ applied to the control winding 12. In other words, changes in the control current $I_c$ are not reflected in changes in the output voltage $V_O$ in a linear matter. The output linearity is affected by core mismatches and variations in the core construction and gate windings. Also, the effects of magnetizing current non-linearities in the B-H loop winding resistance and winding inductance can introduce errors over the full-scale output.

Also, the amplifier 10 is unable to measure a control current $I_c$ on the control winding 12 below the gate winding's magnetizing current. Particularly, even if the control current in the $I_c$ control winding 12 is zero, leakage in the gate windings 16 and 18 provide a current through the resistor 32 that provides an output voltage $V_O$. Therefore, a control current $I_c$ below the magnetizing current of the gate windings 16 and 18 cannot be measured because of system noise.

The bias winding 14 responds in a similar manner to the control winding 12 as the gate windings 16 and 18 through magnetic coupling. Because the bias winding 14 has more turns than the control winding 12 (generally 1000:1), a small amount of bias current $I_b$ in the bias winding 14 would produce the same result as a much greater amount of control current $I_c$ in the control winding 12. The bias winding 14 is generally used to shift the zero current operating point of the amplifier 10 to allow for discrimination of the control current $I_c$ direction. In other words, the output voltage $V_O$ based on the gate winding current $I_g$ will be some value when a bias applied to the bias winding 14, but no control current $I_c$ is flowing through the control winding 12. This discrimination is depicted in FIG. 3 showing the output relationship of a typical 80 amp magnetic amplifier having a 20 amp offset bias on the bias winding 14. By applying the bias current $I_b$ to the bias winding 14, the new zero current operating point of the control winding 12 generates a 1.25 output voltage $V_O$. Thus, the bias winding 14 controls the operating point of the amplifier 10. It is known in the art to provide dual magnetic amplifiers, one including a bias voltage on the bias winding 14, to provide an indication of the current direction through the control winding 12.

SUMMARY OF THE INVENTION

In accordance with the teachings of the present invention, a current control circuit is disclosed that employs a magnetic amplifier and an active feedback circuit. The feedback circuit establishes the effective operating current of the amplifier at a fixed point. The magnetic amplifier includes a pair of oppositely wound gate windings, a bias winding and a control winding. The gate windings are driven by an oscillator driver that generates a gate winding current and a gate winding voltage. A reference voltage and the gate winding voltage are applied to a feedback amplifier in the feedback circuit, and the bias winding is coupled to the source terminal of an FET in the feedback circuit. The output of the feedback amplifier is coupled to the gate terminal of the FET. The drain terminal of the FET provides an output voltage across an output resistor representative of the current flow through the control winding.

The output of the feedback amplifier drives the gate terminal of the FET more positive if the gate winding voltage is lower than the reference voltage. When the gate winding voltage becomes equal to the reference voltage, the feedback circuit is stable, and the gate winding current is set to the desired zero current operating point. The bias current is adjusted in response to changes in the current flow through the control winding to maintain the operating point. The changes in the bias current change the voltage across the output resistor that is proportional to the control current in the control winding. The feedback circuit provides linearity between the control current and the gate voltage, and allows the output voltage to provide an indication of the directional polarity of the control current through the control winding.

The current control circuit can also employ a reset circuit to insure that the output voltage operates on the correct output voltage slope. Further, the reset circuit can reset the feedback circuit if it goes out of the operating range of the magnetic amplifier. Also, the current control circuit can include output amplifier stages that remove the zero current offset provided by the feedback circuit, provide a signal of the direction of the control current, and provide the desired output range of the control current.

Additional advantages and features of the present invention will become apparent from the following description and appended claims, taken in conjunction with the accompanying drawings.

DETAILED DESCRIPTION OF THE EMBODIMENTS

The following discussion of the embodiments of the invention directed to a current monitoring and control circuit employing a magnetic amplifier and a feedback circuit is merely exemplary in nature, and is in no way intended to limit the invention or its applications or uses.

Figure 4:
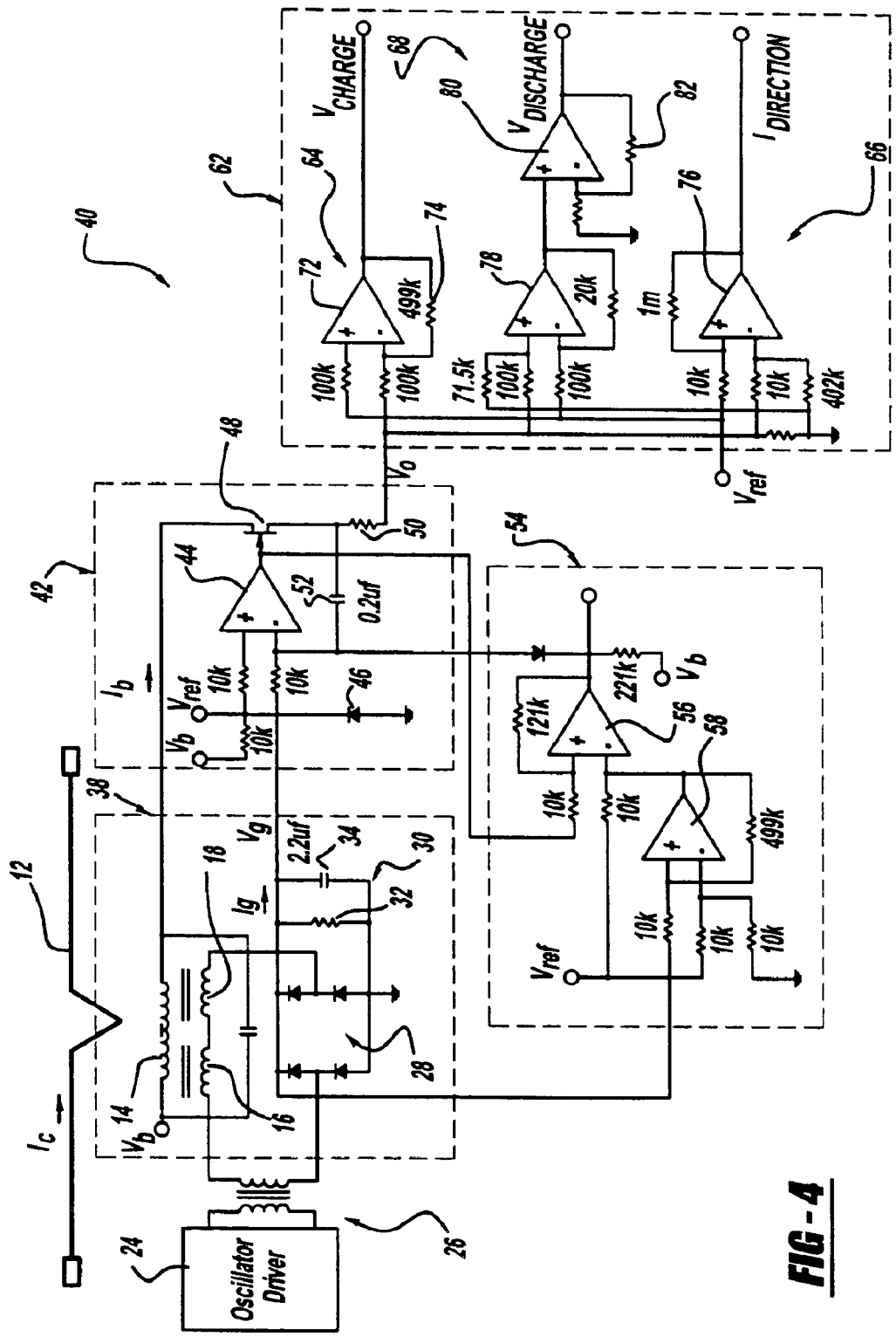
FIG. 4 is a schematic diagram of a current control circuit employing a magnetic amplifier, a feedback circuit, a reset circuit and output amplifier circuits, according to an embodiment of the present invention.

FIG. 4 is a schematic diagram of a current monitoring and control circuit 40, according to an embodiment of the present invention, that includes a magnetic amplifier 38. The elements of the magnetic amplifier 38 are the same as the amplifier 10 discussed above and are identified by the same reference numeral. The control circuit 40 includes an active feedback circuit 42 that sets the operating current of the control circuit 40 so that it remains at a fixed operating point defined by a reference voltage $V_{ref}$, as will be discussed in detail below. By adding the feedback circuit 42, the full operating range of the circuit 40 is not limited by the range of the amplifier 38, and can be expanded to the limit of bias circuitry applying a bias voltage $V_b$ to the bias winding 14. Further, dependencies of the excitation signal quality and external magnetic field effects are virtually eliminated by the feedback circuit 42 so that the output voltage is more linear. Directional sensing (polarity) is inherent in this design because of the offset bias current.

The bias winding 14 is coupled to the feedback circuit 42 and receives the bias voltage $V_b$. The bias current $I_b$ through the bias winding 14 is coupled 180° out of phase with the control winding 12, and therefore acts to cancel the control current $I_c$. The control circuit 40 also includes a negative AC feedback compensation for controlling feedback AC stability. Because of the turns ratio of the bias winding 14 to the control winding 12 (for example, 1000:1), one milliamp of the bias current $I_b$ effectively offsets one amp of the control current $I_c$. In the control circuit 40, the output voltage of the magnetic amplifier 38 is identified as the gate voltage $V_g$, and the output voltage $V_O$ is the output of the feedback circuit 42 that is proportional to the control current $I_c$.

The feedback circuit 42 includes a feedback comparator or amplifier 44 that receives the reference voltage $V_{ref}$ at its positive input and the gate voltage $V_b$ across the resistor 32 at its negative input. In one embodiment, the reference voltage $V_{ref}$ is provided by a precision voltage reference diode 46, such as an LM 113H diode, and can be, for example, 1.2 volts. The output of the feedback amplifier 44 is coupled to the gate terminal of a field effect transistor (FET) 48. The source terminal of the FET 48 is coupled to the bias winding 14 and the drain terminal of the FET 48 is coupled to an output resistor 50, where the output voltage $V_O$ across the resistor 50 is proportional to the control current $I_c$ in the control winding 12. Therefore, as the output of the feedback amplifier 44 increases, the gate terminal FET 48 is driven higher, and more of the bias current $I_b$ from the bias winding 14 is allowed to flow through the resistor 50 to generate the output voltage $V_O$.

In this design, the bias voltage $V_b$ applied to the bias winding 14 is controlled to maintain the gate voltage $V_g$ at the fixed operating point. In other words, as the control current $I_c$ in the control winding 12 changes, the bias voltage $V_b$ is changed so that the gate voltage $V_b$ remains constant at the fixed operating point as set by the reference voltage $V_{ref}$. The bias voltage $V_b$ is measured across the resistor 50 to determine the control current $I_c$. The bias current $I_c$ cancels the influence of the control current $I_c$ by magnetic coupling in the magnetic amplifier 38. When the control current $I_c$ is zero, the bias current $I_b$ stabilizes the gate voltage $V_g$ at the desired operating point determined by the reference voltage $V_{ref}$. If the control current $I_c$ increases in a positive direction, then the bias current $I_b$ is increased to maintain the set point at the output voltage $V_g$, and thus, the output voltage $V_O$ across the resistor 50 will increase. Likewise, if the control current $I_c$ increases in a negative direction, then the bias current $I_b$ is reduced to maintain the gate voltage $V_g$ at the desired operating point, causing the output voltage $V_O$ across the resistor 50 to decrease. Therefore, the control circuit 40 can determine the direction of the control current $I_c$ in the control winding 12 because the circuit 40 knows the output voltage $V_O$ when the control current $I_c$ is zero, and thus, it also knows the direction of the control current $I_c$ by the value of the output voltage $V_O$ when the control current $I_c$ is not zero.

If the gate voltage $V_g$ is at a lower potential than the reference voltage $V_{ref}$, the gate terminal of the FET 48 is driven more positive. As the gate terminal of the FET 48 is driven more positive, the bias current $I_b$ is increased through the resistor 50. Because of the gain of the FET 48, the bias current $I_b$ is drawn through the bias winding 14. An increase in the bias current $I_b$ shifts the magnetic flux in the gate windings 16 and 18 towards the saturation region, causing an increase in the gate current $I_g$ and an increase in the gate voltage $V_g$. As the gate voltage $V_g$ increases towards the reference voltage $V_{ref}$, the output of the feedback amplifier 44 goes to zero, reducing the drive power applied to the gate terminal of the FET 48, and the feedback circuit 42 becomes stable. In the stable mode, the gate voltage $V_g$ is maintained equal to the reference voltage $V_{ref}$. The bias current $I_b$ is set to the desired zero current operating point of the amplifier 38. For example, $V_g$ is set to 1.4 volts.

Figure 5:
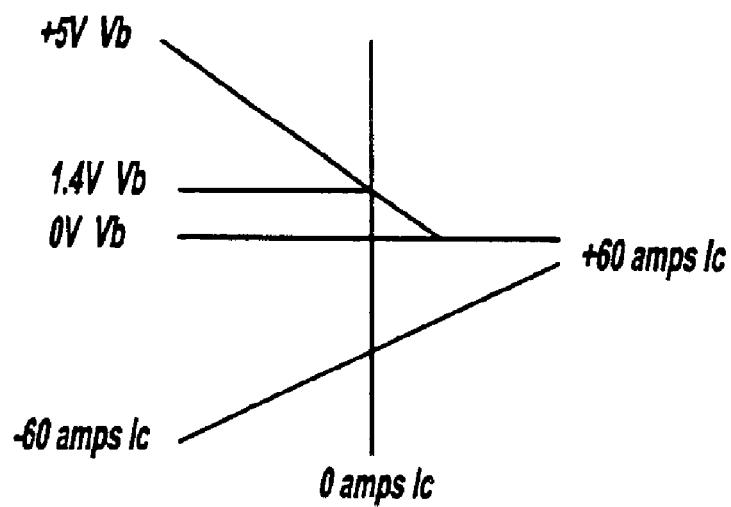
FIG. 5 is a graph showing a feedback circuit output of the current control circuit shown in FIG. 4 as a function of the control current.

When the control current $I_c$ goes more negative, the gate current $I_g$ and the gate voltage $V_g$ tend to decrease. When the gate voltage $V_g$ decreases below the reference voltage $V_{ref}$, the output of the feedback amplifier 44 drives the gate terminal of the FET 48 more positive. As the gate terminal of the FET 48 is driven more positive, the bias current $I_b$ through the resistor 50 increases. Conversely, when the control current $I_c$ goes more positive, the gate current $I_g$ and the gate voltage $V_g$ tend to increase. When the gate voltage $V_g$ increases above the reference voltage $V_{ref}$, the output of the amplifier 44 drives the gate terminal of the FET 48 less positive. As the gate terminal of the FET 48 is driven less positive, the bias current $I_b$ through the resistor 50 decreases. FIG. 5 is a graph showing the output voltage $V_O$ of the feedback circuit 42 as a function of the control current $I_c$.

A large AC ripple could potentially occur on the bias winding 14 at twice its excitation frequency. Therefore, a filtering capacitor 52 is provided to remove this ripple from the output voltage $V_O$. Also, a DC bias voltage of $I_b R_b$, where $R_b$ is the value of the resistor 50, must be subtracted from the output voltage $V_O$ to remove the offset voltage from the output voltage $V_O$.

Figure 1:
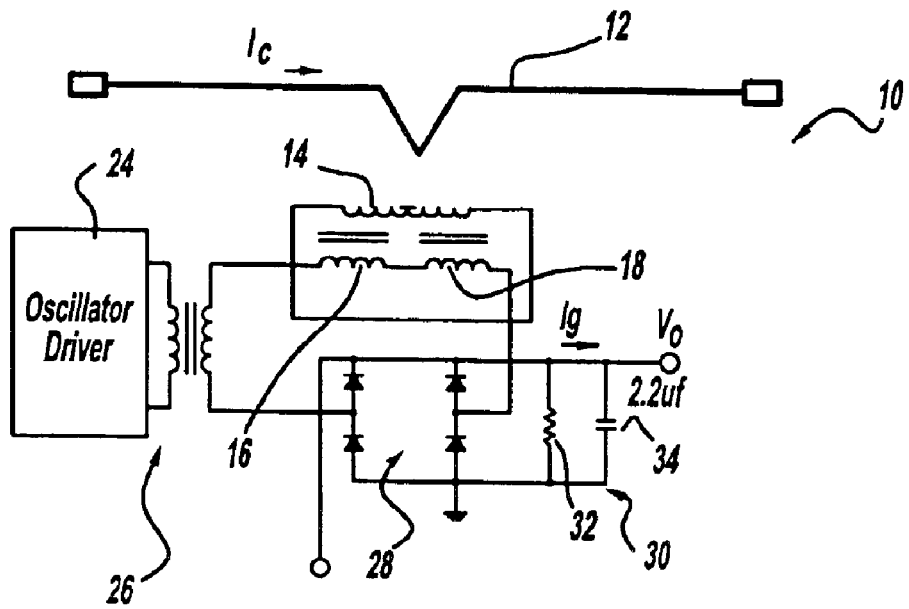
FIG. 1 is a schematic diagram of a known magnetic amplifier.
Figure 2:
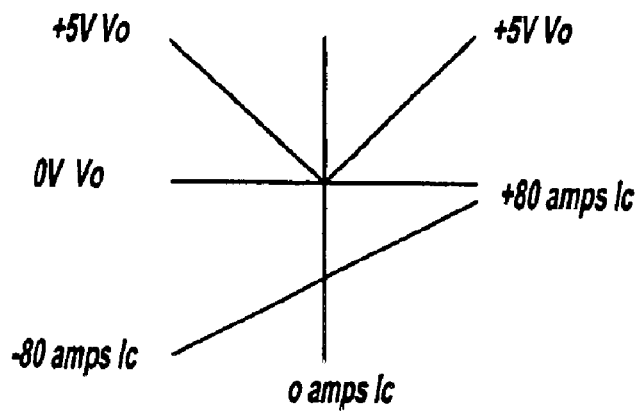
FIG. 2 is a graph showing current versus voltage transfer function for the magnetic amplifier of FIG. 1.
Figure 3:
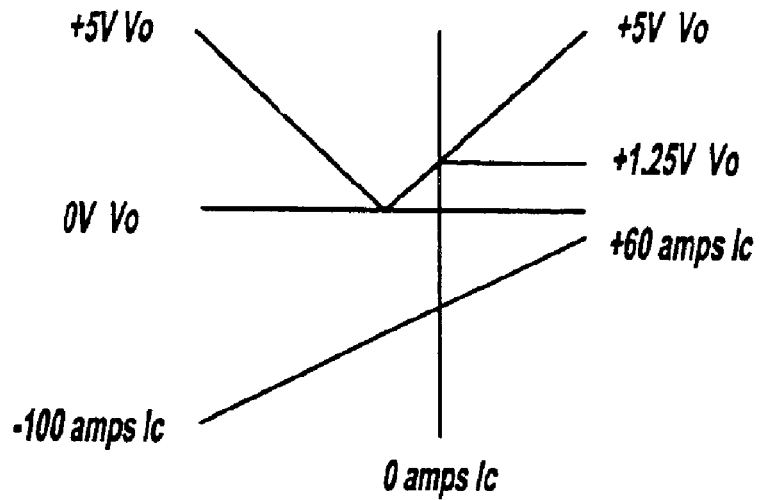
FIG. 3 is a graph showing the output voltage of an 80 amp magnetic amplifier having a 20 amp offset bias.

As discussed above, the conventional magnetic amplifier cannot differentiate between a positive control current $I_c$ and a negative control current $I_c$. The output voltage $V_o$ will go positive when a negative control current $I_c$ is present and will also go positive when a positive control current $I_c$ is present. The operation of the feedback circuit 42 discussed above allows the control circuit 40 to determine the polarity of the control current $I_c$. However, for the feedback circuit 42 to operate properly, the feedback circuit 42 must always operate on the proper slope of the dual slope (FIG. 2) of the gate voltage $V_g$. A large negative transient control current $I_c$ exceeding the design range of the amplifier 38 can erroneously cause the feedback circuit 42 to try to stabilize on the wrong slope of the gate voltage $V_g$. In other words, if the direction of the control current $I_c$ is changing faster than the response time of the amplifier 38, the gate voltage $V_g$ may stabilize on the negative slope of the gate voltage $V_g$. This would cause the control circuit 40 to lock up, and not be able to return to the proper operating slope.

When the control current $I_c$ is driven more negative by an external load demand, the feedback amplifier 44 and the FET 48 will increase the bias current $I_b$ (out of phase with the control current $I_c$) to compensate for the increase in the control current and maintain the feedback circuit 42 in the stable condition. When the bias current $I_b$ can no longer increase due to the supply limitations, the useful range of the feedback circuit 42 is exceeded. As the control current $I_c$ continues to increase into the over-range condition, the output voltage $V_O$ will decrease from the stable reference voltage $V_{ref}$ to zero volts, and then start to increase more positive towards 1.2 volts on the negative slope of the gate voltage $V_g$. As the gate voltage $V_g$ rises above the reference voltage $V_{ref}$ causing the output of the feedback amplifier 44 to drive the gate of the FET 48 negative, the feedback circuit 42 will lock into saturation on the wrong (negative) slope of the output voltage $V_O$.

To protect against this over-range condition, the control circuit 40 includes a reset circuit 54 to detect if the feedback circuit 42 goes out of its operating range, and to return the feedback circuit 42 to its operating range and the proper slope. The reset circuit 54 is necessary in the event the control current $I_c$ changes beyond the rate or amplitude that the feedback circuit 42 can compensate (for example, >2 $I_o$). If the control circuit 40 is attempting to measure a control current $I_c$ that is out of its operating range, then the reset circuit 54 will repeatedly attempt to reset the feedback circuit 42, until the control current $I_c$ returns to the operating range of the amplifier 40. However, if the reset circuit 54 is triggered because the control current $I_c$ is changing its polarity too rapidly, the reset circuit 54 will cause the feedback circuit 42 to return to the proper slope of the gate voltage $V_g$.

The reset circuit 54 includes a first comparator 56 and a second comparator 58. The output of the feedback amplifier 44 is applied to the positive terminal of the first comparator 56, and the gate voltage $V_g$ is applied to the positive terminal of the second comparator 58. The reference voltage $V_{ref}$ is applied to the negative terminals of the comparators 56 and 58. The output of the first comparator 56 is applied to the negative input of the feedback amplifier 44, and the output of the second comparator 58 is applied to the negative input of the first comparator 56. When the output of the feedback amplifier 44 goes below the reference voltage $V_{ref}$, the output of the comparator 56 goes low. This pulls the negative input of the amplifier 44 low to try and force the output of the feedback amplifier 44 back into the linear control region. The feedback amplifier 44 and the comparator 56 are electrically coupled in a cross-strap configuration so that they continue to toggle until the over-range condition is corrected.

When the negative over-range condition is corrected, the positive input of the comparator 58 senses that the gate voltage $V_g$ is reduced below one-half of the reference voltage $V_{ref}$, and the output of the comparator 58 goes low. The output of the comparator 58 pulls the negative input of the comparator 56 low allowing the output of the comparator 56 to return high, which indicates that it is in the proper operating range of the feedback circuit 42. The feedback circuit control is reestablished on the correct slope (negative feedback) and the closed loop control operates correctly. Under large transient load conditions, the feedback circuit 42 can transition from the stable slope where negative feedback controls the feedback circuit regulation to the unstable slope where the feedback goes positive. The reset circuit 54 will respond as with the large DC over-current correct condition, correcting the proper slope after the current transient is terminated. An output of the comparator 56 can set a reset flag so that control circuit knows that the reset circuit 54 has been activated.

The control circuit 40 also includes an output circuit 62 including a first amplifier stage 64, a second amplifier stage 66 and a third amplifier stage 70. The amplifier stages 64, 66 and 68 are responsive to the output voltage $V_0$ and the reference voltage $V_{ref}$. As will be discussed below, the output circuit 62 removes the zero current offset, identifies the control current $I_c$ polarity, and provides the desired output ranges.

The amplifier stage 64 includes an output amplifier 72 that provides an indication of the magnitude of a positive control current $I_c$, such as a positive battery charging current $V_{CHARGE}$ in the control winding 12. The positive input of the output amplifier 72 is coupled to the reference voltage $V_{ref}$ to remove the zero offset bias voltage. The negative input of the output amplifier 72 is coupled to the output voltage $V_0$. When the output voltage $V_0$ is above the reference voltage $V_{ref}$, the output of the output amplifier 72 is driven to ground indicating the control current $I_c$ is zero or negative. As the control current $I_c$ becomes more positive causing the output voltage $V_0$ to decrease below the reference voltage $V_{ref}$, the output of the output amplifier 72 becomes more positive. The output range of the amplifier 72 is set by selecting the value of resistor 74. In one example, the gain of the amplifier 72 is set for 5 volt full scale output equal to 16 amps of positive charge control current $I_c$.

The second amplifier stage 66 includes an output amplifier 76 that an indication of the polarity $I_{DIRECTION}$ of the control current $I_c$. The positive input of the output amplifier 76 is coupled to the reference voltage $V_{ref}$, and the negative input of the amplifier 76 is coupled to the voltage output $V_0$ of the feedback circuit 42. When the voltage $V_0$ is greater than the reference voltage $V_{ref}$, the output of the amplifier 76 is driven low indicating a negative or discharge control current $I_c$. When the control current $I_c$ goes positive, the output voltage $V_0$ will decrease below the reference voltage $V_{ref}$, allowing the output of the amplifier 76 to go high to indicate a positive charge current.

The third amplifier stage 68 includes a first output amplifier 78 and a second output amplifier 80 that provide an output voltage indication of the magnitude of the negative or discharge control current $I_c$, such as a battery discharge $V_{DISCHARGE}$. The negative input of the amplifier 78 is coupled to the reference voltage $V_{ref}$ to remove the zero offset bias voltage, and the positive input of the amplifier 78 is coupled to the output voltage $V_0$. As the discharge control current $I_c$ increases, the output voltage $V_0$ will rise above the reference voltage $V_{ref}$. Because the amplifier 78 is coupled as a non-inverting stage, the output of the amplifier 78 will increase as its positive input increases with a predetermined gain factor. The output of the amplifier 78 is coupled to the positive input of the amplifier 80, which is also coupled as a non-inverting amplifier. The output of the amplifier 80 will also increase with a predetermined gain factor as the output voltage $V_o$ increases.

In one embodiment, the gain of the amplifiers 72, 76, 78 and 80 are set to indicate 16 amps of positive charge current and 60 amps of negative charge current. Drifts in the reference voltage $V_{ref}$ are partially compensated and designed because the voltage $V_{ref}$ is used to determine the output voltage $V_0$, and thus the output current $I_o$, and also to cancel the offset voltage. Thus, with a fixed reference voltage $V_{ref}$, the resistors 32 and 50 can be used to determine the zero offset current, and the resistor 74 and 82 can be selected to determine the output full-scale current ranges for charge and discharge current.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A current monitoring and control circuit for monitoring current flow through a control winding, said monitoring and control circuit comprising:

a magnetic amplifier, said magnetic amplifier including a first gate winding and a second gate winding electrically coupled in series and responsive to an AC drive voltage, said magnetic amplifier further including a bias winding responsive to a variable bias potential, said bias winding and said first and second gate windings being magnetically coupled to the control winding, said magnetic amplifier providing a gate voltage; and a feedback circuit, said feedback circuit being electrically coupled to the bias winding, said feedback circuit being responsive to a reference voltage and the gate voltage, said control circuit changing the bias potential in response to changes in the control current so that the gate voltage remains substantially constant at a fixed operating point, said bias voltage providing a bias current through the feedback circuit that provides an output voltage indicative of the direction and magnitude of the current flow through the control winding.

2. The control circuit according to claim 1 wherein the bias current in the feedback circuit increases or decreases relative to a zero control current to provide the direction of the control current.

3. The control circuit according to claim 1 wherein the control current and the output voltage are substantially linear.

4. The control circuit according to claim 1 wherein the feedback circuit is stable at the fixed operating point when the gate voltage is substantially equal to the reference voltage.

5. The control circuit according to claim 1 wherein the feedback circuit includes a feedback amplifier having a first input and a second input, and an FET, wherein the first input of the feedback amplifier is responsive to the reference voltage and the second input of the feedback amplifier is responsive to the gate voltage from the magnetic amplifier, and wherein a gate terminal of the FET is responsive to an output of the feedback amplifier, a source terminal of the FET is responsive to the bias voltage and the drain terminal of the FET provides the output voltage across an output resistor.

6. The control circuit according to claim 1 further comprising a reset circuit, said reset circuit being coupled to the magnetic amplifier and the feedback circuit, said reset circuit resetting the feedback circuit if the feedback circuit operates on an improper slope of the output voltage in response to sudden changes in the direction of the control current, said reset circuit also resetting the feedback circuit if the magnetic amplifier goes out of its operating range.

7. The control circuit according to claim 6 wherein the reset circuit includes a first comparator and a second comparator, said first comparator being responsive to a feedback signal from the feedback circuit and the reference voltage, and said second comparator being responsive to the gate voltage and the reference voltage.

8. The control circuit according to claim 1 further comprising an output circuit, said output circuit being responsive to the reference voltage and the bias current and removing a zero current offset provided by the fixed operating point.

9. The control circuit according to claim 1 wherein the output circuit includes a plurality of output amplifier stages each being responsive to the output voltage from the feedback circuit and the reference voltage, wherein a first output stage provides an output signal indicative of the magnitude of a positive current flow through the control winding, a second output amplifier stage provides an output signal indicative of the direction of the current in the control, winding, and a third output amplifier stage provides an output signal indicative of the magnitude of a negative current flow through the control winding.

10. A current monitoring and control circuit for monitoring current flow through a control winding, said monitoring and control circuit comprising:

a magnetic amplifier, said magnetic amplifier including a first gate winding and a second gate winding electrically coupled in series and responsive to an AC drive voltage, said magnetic amplifier further including a bias winding responsive to a variable bias potential and a rectifier for rectifying the current flow to the first and second gate windings and providing a gate voltage, said bias winding and said first and second gate windings being magnetically coupled to the control winding;

a feedback circuit, said feedback circuit being electrically coupled to the bias winding and to the rectifier, said feedback amplifier including a first input and a second input, and an FET, wherein the first input of the feedback amplifier is responsive to a reference voltage and the second input of the feedback amplifier is responsive the gate voltage from the magnetic amplifier, and wherein a gate terminal of the FET is responsive to an output of the feedback amplifier, a source terminal of the FET is responsive to the bias voltage and the drain terminal of the FET provides an output voltage across an output resistor that is indicative of the direction and magnitude of the current flow through the control winding, said feedback circuit forcing the magnetic amplifier to operate at a fixed operating point determined by the reference voltage, said control circuit changing the bias potential in response to changes in the control current so that the gate voltage remains substantially constant at the fixed operating point; and a reset circuit electrically coupled to the magnetic amplifier and the feedback circuit, said reset circuit resetting the feedback circuit if the feedback circuit operates on an improper slope of the output voltage in response to sudden changes in the direction of the control circuit, said reset circuit also resetting the feedback circuit if the magnetic amplifier goes out of its operating range.

11. The control circuit according to claim 10 wherein the reset circuit includes a first comparator and a second comparator, said first comparator being responsive to a feedback signal from the feedback circuit and the reference voltage, and said second comparator being responsive to the gate voltage and the reference voltage.

12. The control circuit according to claim 11 wherein an output of the first comparator is coupled to the second input of the feedback amplifier.

13. The control circuit according to claim 11 wherein the first comparator and the feedback amplifier are electrically coupled in a cross-strap configuration.

14. The control circuit according to claim 10 further comprising an output circuit, said output circuit being responsive to the reference voltage and the bias current and removing a zero current offset provided by the fixed operating point.

15. The control circuit according to claim 10 wherein the output circuit includes a plurality of output amplifier stages each being responsive to the output voltage from the feedback circuit and the reference voltage, wherein a first output stage provides an output signal indicative of the magnitude of a positive current flow through the control winding, a second output amplifier stage provides an output signal indicative of the direction of the current in the control winding, and a third output amplifier stage provides an output signal indicative of the magnitude of a negative current flow through the control winding.

16. A current monitoring and control circuit for monitoring current flow through a control winding, said monitoring and control circuit comprising:

a magnetic amplifier, said magnetic amplifier including a first gate winding and a second gate winding electrically coupled in series and responsive to an AC drive voltage, said magnetic amplifier further including a bias winding responsive to a variable bias potential and a rectifier for rectifying the current flow to the first and second gate windings and providing a gate voltage, said bias winding and said first and second gate windings being magnetically coupled to the control winding;

a feedback circuit, said feedback circuit being electrically coupled to the bias winding and to the rectifier, said feedback circuit being responsive to a reference voltage and the gate voltage, said control circuit changing the bias potential in response to changes in the control current so that the gate voltage remains substantially constant at a fixed operating point, said bias voltage providing a bias current through the feedback circuit that provides an output voltage indicative of the direction and magnitude of the current flow through the control winding, said feedback circuit forcing the magnetic amplifier to operate at the fixed operating point determined by the reference voltage;

a reset circuit electrically coupled to the magnetic amplifier and the feedback circuit, said reset circuit resetting the feedback circuit if the feedback circuit operates on an improper slope of the output voltage in response to sudden changes in the direction of the control circuit and resetting the feedback circuit if the magnetic amplifier goes out of its operating range; and a plurality of output stages responsive to the output voltage from the feedback circuit and the reference voltage, said output stages providing a magnitude of the control current, a direction of the control current and removing a zero current offset provided by the fixed operating point.

17. The control circuit according to claim 16 wherein the feedback circuit includes a feedback amplifier having a first input and a second input, and an FET, wherein the first input of the feedback amplifier is responsive to the reference voltage and the second input of the feedback amplifier is responsive to the gate voltage from the magnetic amplifier, and wherein a gate terminal of the FET is responsive to an output of the feedback amplifier, a source terminal of the FET is responsive to the bias voltage and the drain terminal of the FET provides the output voltage across an output resistor.

18. The control circuit according to claim 16 wherein the reset circuit includes a first comparator and a second comparator, said first comparator being responsive to a feedback signal from the feedback circuit and the reference voltage, and said second comparator being responsive to the gate voltage and the reference voltage.

19. The control circuit according to claim 16 wherein the plurality of output amplifier stages are responsive to the output voltage from the feedback circuit and the reference voltage, wherein a first output stage provides an output signal indicative of the magnitude of a positive current flow through the control winding, a second output amplifier stage provides an output signal indicative of the direction of the current in the control winding, and a third output amplifier stage provides an output signal indicative of the magnitude of a negative current flow through the control winding.

* * * * *